US007297465B2

(12) United States Patent
Van Aert et al.

(10) Patent No.: US 7,297,465 B2
(45) Date of Patent: Nov. 20, 2007

(54) HEAT-SENSITIVE LITHOGRAPHIC PRINTING PLATE PRECURSOR

(75) Inventors: Huub Van Aert, Pulderbos (BE); Bert Groenendaal, Sinaai (BE); Marc Van Damme, Bonheiden (BE)

(73) Assignee: AGFA Graphics NV, Mortsel (BE)

( * ) Notice: Subject to any disclaimer, the term of this patent is extended or adjusted under 35 U.S.C. 154(b) by 0 days.

(21) Appl. No.: 10/834,553

(22) Filed: Apr. 29, 2004

(65) Prior Publication Data

US 2005/0136355 A1 Jun. 23, 2005

Related U.S. Application Data

(60) Provisional application No. 60/536,430, filed on Jan. 14, 2004.

(30) Foreign Application Priority Data

Dec. 18, 2003 (EP) ................................. 03104786

(51) Int. Cl.

| | |
|---|---|
| ***G03F 7/038*** | (2006.01) |
| ***G03F 7/039*** | (2006.01) |
| ***G03F 7/09*** | (2006.01) |
| ***G03F 7/20*** | (2006.01) |
| ***G03F 7/30*** | (2006.01) |

(52) U.S. Cl. .............................. 430/271.1; 430/270.1; 430/302; 430/326; 430/944

(58) Field of Classification Search ............. 430/270.1, 430/271.1, 944, 325, 302, 348, 945, 964
See application file for complete search history.

(56) References Cited

U.S. PATENT DOCUMENTS

| | | | | |
|---|---|---|---|---|
| 5,360,571 | A * | 11/1994 | Kilgour et al. | 516/55 |
| 2001/0001701 | A1* | 5/2001 | Damme et al. | 430/271.1 |

FOREIGN PATENT DOCUMENTS

| | | | |
|---|---|---|---|
| EP | 0 823 327 | A2 * | 2/1998 |
| EP | 0 864 420 | A1 | 9/1998 |
| EP | 0 908 304 | A1 | 4/1999 |
| EP | 0 908 306 | A2 | 4/1999 |
| EP | 0 950 517 | A1 | 10/1999 |
| EP | 0 950 518 | A1 | 10/1999 |
| WO | WO 97/39894 | A1 | 10/1997 |
| WO | WO 99/21715 | A1 | 5/1999 |
| WO | WO 99/21725 | A1 | 5/1999 |

* cited by examiner

*Primary Examiner*—Sin Lee
(74) *Attorney, Agent, or Firm*—Leydig, Voit & Mayer, Ltd

(57) ABSTRACT

According to the present invention there is provided a positive-working lithographic printing plate precursor which comprises on a support having a hydrophilic surface or which is provided with a hydrophilic layer, an oleophilic coating comprising an infrared absorbing agent, an alkali-soluble polymeric binder and a polysiloxane which comprises at least one carboxylic acid group or a salt thereof. The disclosed printing plate precursor has an improved sensitivity and at the same time a high under exposure latitude and a high developer resistance.

30 Claims, 2 Drawing Sheets

HEAT-SENSITIVE LITHOGRAPHIC PRINTING PLATE PRECURSOR

CROSS-REFERENCE TO RELATED PATENT APPLICATIONS

This application claims the benefit of U.S. Provisional Application No. 60/536,430 filed Jan. 14, 2004, which is incorporated by reference. In addition, this application claims the benefit of European Application No. 03104786.3 filed Dec. 18, 2003, which is also incorporated by reference.

FIELD OF THE INVENTION

The present invention relates to a heat-sensitive, positive working lithographic printing plate precursor.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

A typical printing plate precursor for computer-to-film methods comprise a hydrophilic support and an image-recording layer of a photosensitive polymer which include UV-sensitive diazo compounds, dichromate-sensitized hydrophilic colloids and a large variety of synthetic photopolymers. Particularly diazo-sensitized systems are widely used. Upon image-wise exposure, typically by means of a film mask in a UV contact frame, the exposed image areas become insoluble and the unexposed areas remain soluble in an aqueous alkaline developer. The plate is then processed with the developer to remove the diazonium salt or diazo resin in the unexposed areas. So the exposed areas define the image areas (printing areas) of the printing master, and such printing plate precursors are therefore called 'negative-working'. Also positive-working materials, wherein the exposed areas define the non-printing areas, are known, e.g. plates having a novolac/naphtoquinone-diazide coating which dissolves in the developer only at exposed areas.

In addition to the above photosensitive materials, also heat-sensitive printing plate precursors have become very popular. Such thermal materials offer the advantage of daylight-stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilisation by cross-linking of a polymer, heat-induced solubilisation, decomposition, or particle coagulation of a thermoplastic polymer latex.

EP 0 864 420 discloses a heat mode imaging element for making lithographic printing plates comprising on a lithographic base having a hydrophilic surface an intermediate layer comprising a polymer, soluble in an aqueous alkaline solution and a top layer that is sensitive to IR-radiation wherein said top layer upon exposure to IR-radiation has a decreased or increased capacity for being penetrated and/or solubilised by an aqueous alkaline solution.

EP 0 908 304 and EP 0 908 306 disclose a heat mode imaging element consisting of a lithographic base with a hydrophilic surface and an IR-radiation sensitive top layer, comprising a polymer that is soluble in an aqueous alkaline solution and that is unpenetrable for an alkaline developer containing $SiO_2$ as silicates.

The last two heat-mode imaging elements have the disadvantage that the difference between the solubility in the exposed areas and in the non-exposed areas is not very great so that also non-exposed areas are dissolved during the processing of the element so that the plates could not be used as lithographic plates.

WO 97/39894 describes a positive-working heat-sensitive printing plate precursor which is sensitive to IR light but not to UV light, comprising a support and an IR-sensitive coating comprising an oleophilic polymer that is soluble in an aqueous alkaline developer and a dissolution inhibitor which reduces the solubility of the polymer in the developer.

WO99/21725 and WO99/21715 describe a heat sensitive printing plate precursor provided with a coating comprising a compound which increases the developer resistance of the coating. Said compound is selected from the group of poly(alkylene oxide), siloxanes and esters or amides of polyhydric alcohols.

EP 0 950 517 and EP 0 950 518 describe a heat mode imaging element for providing a lithographic printing plate comprising a base with a hydrophilic surface, a first layer comprising a polymer soluble in an aqueous alkaline solution and an infrared sensitive top layer, wherein at least one of said layers comprise a surfactant such as a polysiloxane.

The prior art printing plate precursors comprising compounds which increase the developer resistance of the coating such as for example polysiloxanes, also have a broad development latitude, i.e. the differentiation between the development kinetics of exposed and non-exposed areas is increased in the sense that exposed areas are completely dissolved before the non-exposed areas start to dissolve. However, the minimum energy density required to solubilize the exposed areas in the developer of these printing plate precursors is high, and therefore, long exposure times and/or the use of more expensive exposure devices such as lasers with a high laser power output are required.

Therefore, there is still a need for printing plate precursors which have an improved sensitivity and at the same time a high under exposure latitude and a high developer resistance.

SUMMARY OF THE INVENTION

It is an aspect of the present invention to provide a positive-working, heat-sensitive lithographic printing plate precursor which has an improved sensitivity and at the same time a high under exposure latitude and a high developer resistance.

This object is realized by providing a printing plate precursor comprising on a support having a hydrophilic surface or which is provided with a hydrophilic layer, an oleophilic coating comprising an infrared absorbing agent, an alkali-soluble polymeric binder and a polysiloxane, characterized in that said polysiloxane comprises at least one carboxylic acid group or a salt thereof.

Surprisingly, it was found that the heat-sensitive lithographic printing plate precursor of the present invention comprising the polysiloxane comprising at least one carboxylic acid group or a salt thereof, has an improved sensitivity without significant reduction of the developer resistance,—compared to printing plate precursors comprising a polysiloxane of the prior art.

Specific embodiments of the invention are defined in the dependent claims.

BRIEF DESCRIPTON OF THE DRAWINGS

DETAILED DESCRIPTION OF THE INVENTION

Figure 1:
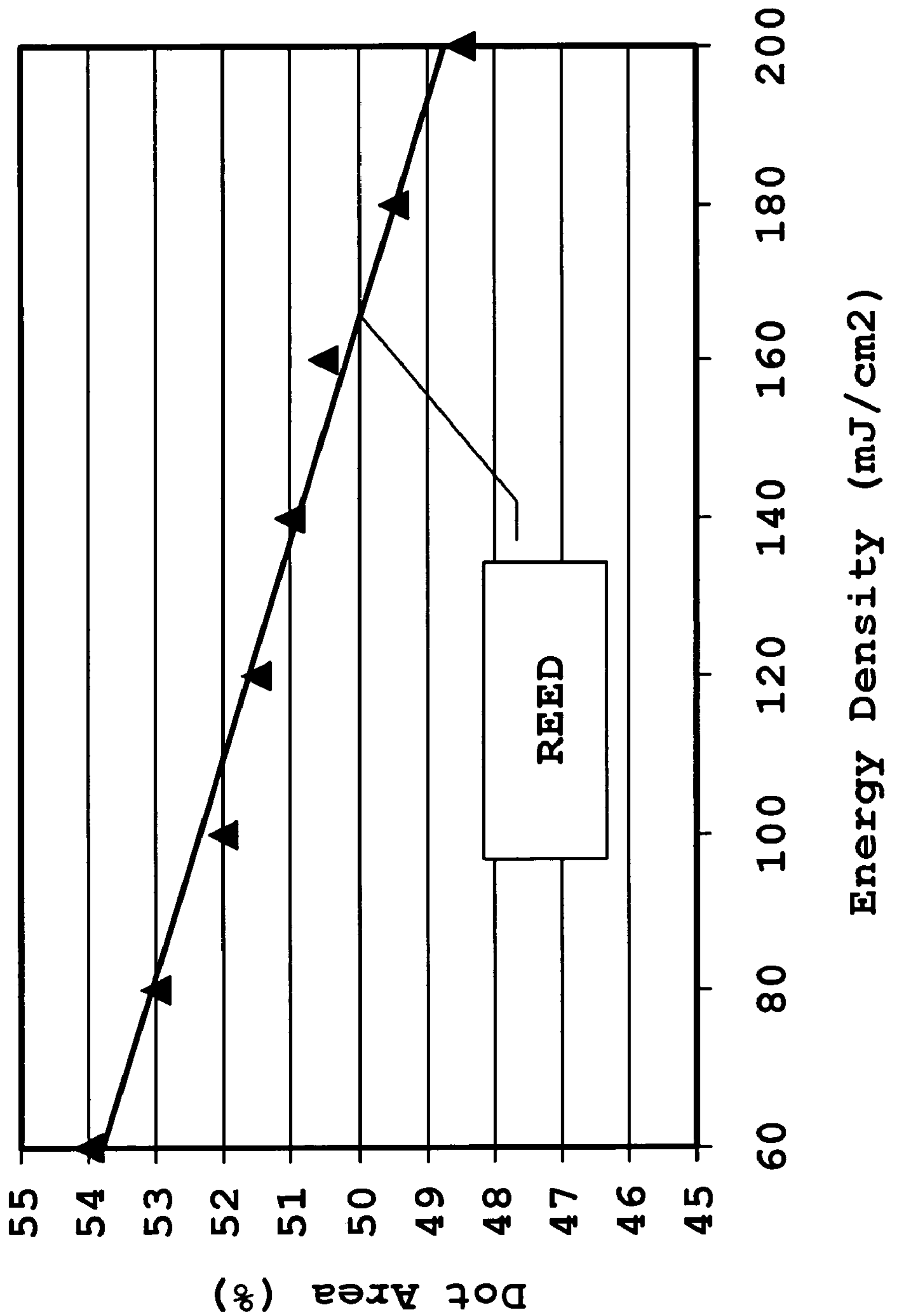
FIG. 1 shows the relationship between the dot area on the plate of Invention Example 1, exposed with a 50% halftone screen @200 lpi (about 80 lines/cm) and the energy density of the exposure.

The positive-working lithographic printing plate precursor of the present invention comprises a support having a hydrophilic surface or which is provided with a hydrophilic layer and an oleophilic coating provided thereon. The oleophilic coating comprises an infrared absorbing agent, an alkali-soluble polymeric binder and a polysiloxane, wherein said polysiloxane comprises at least one carboxylic acid group or a salt thereof.

Hereinafter, the polysiloxane comprising at least one carboxylic acid group or a salt thereof is also referred to as “a carboxylic acid modified polysiloxane” or “CAM-polysiloxane”. The CAM-polysiloxane contains a polysiloxane chain and at least one carboxylic acid group or a salt thereof. The polysiloxane chain in the CAM-polysiloxane may be a linear, cyclic or complex cross-linked polymer or copolymer comprising a plurality of siloxane recurring units. The siloxane recurring units may be represented by —Si(R,R')—O—, wherein R and R' are optionally substituted alkyl or aryl groups. Preferred siloxane recurring units are alkyl and/or arylsiloxanes; preferably diphenyl-siloxanes, dimethyl-siloxanes and phenylmethyl-siloxanes; most preferably dimethyl-siloxanes. The number of siloxane recurring units is at least 2, preferably at least 10, more preferably at least 20, and preferably less than 100, more preferably less than 60. A suitable CAM-polysiloxane comprises preferably about 15 to 25 siloxane units.

The alkyl group or the aryl group of the siloxane recurring units may be substituted by a substituent; a preferred substituent is represented by a polyalkylene-oxide group. The polyalkylene-oxide group comprises a plurality of alkylene-oxide recurring units of the formula $—C_nH_{2n}—O—$ wherein n is preferably an integer in the range 2 to 5. Preferred alkylene-oxide recurring units are typically ethylene oxide, propylene oxide or mixtures thereof. The moiety $—C_nH_{2n}—$ may include straight or branched chains and may also be substituted. The number of the recurring units range preferably between 2 and 10 units, more preferably between 2 and 5 units, and preferably less than 100, more preferably less than 60.

The CAM-polysiloxane may also be a block copolymer comprising a polysiloxane chain as defined above, a polyalkylene oxide chain and at least one carboxylic acid group or salt thereof. The polyalkylene oxide chain comprises alkylene oxide recurring units as defined above for the alkylene oxide group.

The CAM-polysiloxane may also be a graft-copolymer comprising a polysiloxane chain as defined above, at least one macromonomer comprising a polyalkylene oxide group as defined above, and at least one carboxylic acid group or salt thereof.

One or more carboxylic acid groups or salts thereof are present in the CAM-polysiloxane; at least one of them may be located at the end of the polysiloxane chain and/or at the end of the polyalkylene oxide group or chain. Alternatively they may be bounded on the R or R' group of the recurring unit of the polysiloxane chain (—Si(R,R')—O—) or on the $—C_nH_{2n}—$ moiety of the polyalkylene-oxide chain. The salt form of the carboxylic acid is preferably an alkali salt such as a $Li^+$, $Na^+$ or $K^+$ salt or an ammonium salt. The carboxylic acid groups or salts thereof can be bounded via a linking group L such as alkylene, arylene, heteroarylene, —O—, $—O—(CH_2)_k—$, $—O—CO—(CH_2)_k—$, $—(CH_2)_k—O—CO—(CH_2)_l—$, $—(CH_2)_k—CO—(CH_2)_l—$, $—CO—O—(CH_2)_k—$, $—(CH_2)_k—$ or $—(CH_2)_l—$, $—CO—(CH_2)_k—$ or combinations thereof; wherein k and 1 independently represent an integer ≦1. Preferred linking groups are represented by an alkylene, $—O—(CH_2)_k—$, $—(CH_2)_k—CO—(CH_2)_l—$ or $—CO—(CH_2)_k—$. The number of acid groups or salts thereof which are present in the CAM-polysiloxane is at least 1, preferably at least 2. The average molecular weight ($M_W$) of the CAM-polysiloxane is preferably between 500 and 10000 g/mol; more preferably between 600 and 7000 g/mol, most preferably between 700 and 5000 g/mol.

Examples of CAM-polysiloxanes are listed below.

LIST OF CAM-POLYSILOXANES

SIL 1: SLM 441075/4 (01 M642) obtained from Wacker,
SIL 2: Rhodosorsil Huile 1669 obtained from Rhodia,
SIL 3: X22-3710 obtained from Shin Etsu,
SIL 4: X22-162C obtained from Shin Etsu,
SIL 5: Tegomer C Si-2342 obtained from Goldschmidt,
SIL 6: Tegomer C Si-2142 obtained from Goldschmidt,
Sil 7: DMS B12, obtained from ABCR.

The oleophilic coating may comprises one or more distinct layers and the CAM-polysiloxane may be present in the layer comprising the hydrophilic binder, in an optional other layer or in a separate top layer of the coating i.e. the outermost layer of the coating. In the latter embodiment, the CAM-polysiloxane can be applied in a second solution, coated on top of the other layer(s). It may be advantageous to use a solvent in the second coating solution that is not capable of dissolving the ingredients present in the other layer(s) so that a highly concentrated CAM-polysiloxane phase is obtained at the top of the coating forming a separate top layer. This top layer may act as a barrier layer which shields the coating from the developer and may reduce the rate of dissolution of the coating in the developer. By exposure to heat or infrared light the penetrability of the barrier layer by the developer may be enhanced resulting in an increased rate of dissolution of the coating in the developer.

The amount of CAM-polysiloxane in the heat-sensitive coating may vary between 0.5 and 25 $mg/m^2$, preferably between 0.5 and 15 $mg/m^2$ and most preferably between 0.5 and 10 $mg/m^2$.

The oleophilic coating may further comprise other polymers comprising siloxane and/or perfluoroalkyl units. These polymers may act for example as a spreading agent resulting in an improved coating quality and may further increase the developer resistance of the alkali-soluble coating. By exposure to heat and/or infrared light, the imaged parts solubilize upon development before the non-imaged parts start to solubilize.

Surprisingly, it was found that the printing plate precursors of the present invention comprising a CAM-polysiloxane, compared to printing plate precursors comprising polysiloxanes of the prior art, such as Tego Glide 410, Tego Wet 265, Tego Protect 5001 or Silikophen P50/X, all commercially available from Tego Chemie, Essen, Germany, exhibit an improved sensitivity while the developer resistance is not substantially reduced. “Not substantially reduced” means that the value of the developer resistance, hereinafter also referred to as “DR”, as defined in the Examples section below, may reduce by at most 7%, more preferably at most 5%, most preferably at most 3%. The sensitivity is determined by the real exposed sensitivity, hereinafter also referred to as “right exposure energy density” or “REED”, and the clearing point sensitivity, hereinafter also referred to as “clearing point” or “CP”. REED and CP are defined in the Examples section below. In the present invention an improved sensitivity means that the printing plate precursor is characterized by a low REED value and a low CP value in such a way that the under exposure latitude, hereinafter also referred to as “UEL”, as defined in the Examples section below, is at least 30%, preferably at least 40% and more preferably at least 50%.

In accordance with the present invention, the alkali-soluble polymeric binder is preferably a phenolic resin, e.g. novolac, resoles, polyvinyl phenols and carboxy-substituted polymers. Typical examples of such polymers are described in DE-A 400 74 28, DE-A 402 73 01 and DE-A 444 58 20. In addition, the coating may comprise polymers which improve the printing run length and/or the chemical resistance of the plate. Examples thereof are polymers comprising sulfonamido ($—SO_2—NR—$) or imido (—CO—NR—CO—) pendant groups, wherein R is hydrogen, optionally substituted alkyl or optionally substituted aryl, such as the polymers described in EP-A 894 622, EP-A 901 902, EP-A 933 682 and WO 99/63407.

In a preferred embodiment of the present invention, the alkali-soluble polymeric binder is preferably a phenolic resin wherein the phenyl group or the hydroxy group of the phenolic monomeric unit are chemically modified with an organic substituent. The phenolic resins which are chemically modified with an organic substituent may exhibit an increased chemical resistance against printing chemicals such as fountain solutions or press chemicals such as plate cleaners. Examples of such alkali-soluble phenolic resins, which are chemically modified with an organic substituent, are described in EP-A 0 934 822, EP-A 1 072 432, U.S. Pat. No. 5,641,608, EP-A 0 982 123, WO 99/01795, EP-A 02 102 446, filed on 15/10/2002, EP-A 02 102 444, filed on 15/10/2002, EP-A 02 102 445, filed on 15/10/2002, EP-A 02 102 443, filed on 15/10/2002, EP-A 03 102 522, filed on 13/08/2003.

The modified resins described in EP-A 01 102 446, filed on 15/10/2002, are preferred, specially those resins wherein the phenyl-group of the phenolic monomeric unit of said phenolic resin is substituted with a group having the structure —N=N-Q, wherein the —N=N— group is covalently bound to a carbon atom of the phenyl group and wherein Q is an aromatic group, most preferably wherein Q is the following formula (I):

(Formula I)

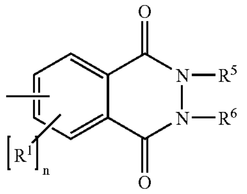

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen, —N-phthalimidyl, -M-N-phthalimidyl, or $-M-R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

Other preferred alkali-soluble phenolic resins are phenolic resins wherein the phenyl-group of the phenolic monomeric unit or the hydroxy-group of the phenolic monomeric unit is substituted with a group having the structure of formula (I) as defined above.

The coating provided on the support is heat-sensitive, thereby providing a plate precursor which can be handled in normal working lighting conditions (daylight, fluorescent light) for several hours. The coating preferably does not contain UV-sensitive compounds which have an absorption maximum in the wavelength range of 200 nm to 400 nm such as diazo compounds, photoacids, photoinitiators, quinone diazides, or sensitizers.

Besides the layers discussed above and hereafter, the oleophilic coating may further comprise e.g. a “subbing” layer which improves the adhesion of the coating to the support, a covering layer which protects the coating against contamination or mechanical damage, and/or a light-to-heat conversion layer which comprises an infrared light absorbing compound.

The coating is positive-working and capable of heat-induced solubilization, i.e. the coating is resistant to the developer and ink-accepting in the non-exposed state and becomes soluble in the developer upon exposure to heat or infrared light to such an extent that the hydrophilic surface of the support is revealed thereby.

In a preferred embodiment, the coating also contains one or more dissolution inhibitors, i.e. one or more materials which reduce the dissolution rate of the polymeric binder in the aqueous alkaline developer at the non-exposed areas of the coating. The dissolution inhibiting capability of the inhibitor can easily be tested by coating two samples on a support: a reference sample containing only the alkali-soluble polymeric binder and another including both the polymeric binder (in equal amounts as the reference) as well as the inhibitor. A series of unexposed samples is immersed in an aqueous alkaline developer, each sample during a different time period. After the immersion period, the sample is removed from the developer, immediately rinsed with water, dried and then the dissolution of the coating in the developer is measured by comparing the weight of the sample before and after the development. As soon as the coating is dissolved completely, no more weight loss is measured upon longer immersion time periods, i.e. a curve representing weight loss as a function of immersion time reaches a plateau from the moment of complete dissolution of the layer. A material has good inhibiting capability when the coating of the sample without the inhibitor has dissolved completely in the developer before the sample with the inhibitor is attacked by the developer to such an extent that the ink-accepting capability of the coating is affected.

The dissolution inhibitor(s) which can be added to the layer which comprises the alkali-soluble polymeric binder, reduces the dissolution rate of the non-exposed coating in the developer by interaction between the polymeric binder and the inhibitor, due to e.g. hydrogen bonding between these compounds. The dissolution inhibiting capability of the inhibitor is preferably reduced or destroyed by the heat generated during the exposure so that the coating readily dissolves in the developer at exposed areas. Such inhibitors are preferably organic compounds which comprise at least one aromatic group and a hydrogen bonding site, e.g. a carbonyl group, a sulfonyl group, or a nitrogen atom which may be quaternized and which may be part of a heterocyclic ring or which may be part of an amino substituent of said organic compound. Suitable dissolution inhibitors of this type have been disclosed in e.g. EP-A 825 927 and 823 327. Some of the compounds mentioned below, e.g. infrared dyes such as cyanines and contrast dyes such as quaternized triarylmethane dyes can also act as a dissolution inhibitor.

Preferably, also one or more development accelerators are included in the coating, i.e. compounds which act as dissolution promoters because they are capable of increasing the dissolution rate of the non-exposed coating in the developer. The simultaneous application of dissolution inhibitors and accelerators allows a precise fine tuning of the dissolution behavior of the coating. Suitable dissolution accelerators are cyclic acid anhydrides, phenols or organic acids. Examples of the cyclic acid anhydride include phthalic anhydride, tetrahydrophthalic anhydride, hexahydrophthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole. Polymeric development accelerators such as phenolic-formaldehyde resins comprising at least 70 mol % meta-cresol as recurring monomeric unit or comprising at least 40 mol % of mono-hydroxy benzene as recurring monomeric unit are also suitable development accelerators. Other examples of polymeric developer accelerators are phenolic resins comprising at least 5 mol % of a recurring unit having at least one phenolic hydroxyl group and at least one alkali solubilising group such as e.g. resorcinol, pyrocatechol, hydroquinone, hydroxy hydroquinone, pyrogallol, phloroglucinol or dihydroxy benzoic acid.

The material can be image-wise exposed directly with heat, e.g. by means of a thermal head, or indirectly by infrared light, which is preferably converted into heat by an infrared light absorbing compound, which may be a dye or pigment having an absorption maximum in the infrared wavelength range. The concentration of the sensitizing dye or pigment in the coating is typically between 0.25 and 10.0 wt. %, more preferably between 0.5 and 7.5 wt. % relative to the coating as a whole. Preferred IR-absorbing compounds are dyes such as cyanine or merocyanine dyes or pigments such as carbon black. A suitable compound is the following infrared dye:

IR-1

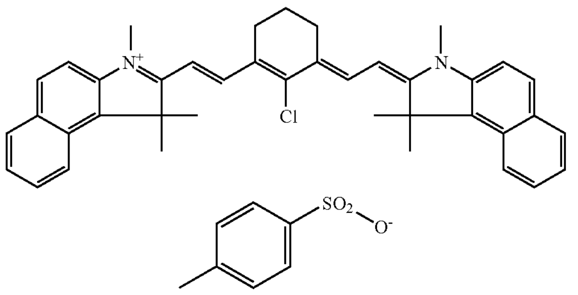

The coating may further contain an organic dye which absorbs visible light so that a perceptible image is obtained upon image-wise exposure and subsequent development. Such a dye is often called contrast dye or indicator dye. Preferably, the dye has a blue color and an absorption maximum in the wavelength range between 600 nm and 750 nm. Although the dye absorbs visible light, it preferably does not sensitize the printing plate precursor, i.e. the coating does not become more soluble in the developer upon exposure to visible light. Suitable examples of such a contrast dye are the quaternized triarylmethane dyes.

The infrared light absorbing compound and the contrast dye may be present in the layer comprising the alkali-soluble polymeric binder, and/or in the top layer discussed above and/or in an optional other layer. According to a highly preferred embodiment, the infrared light absorbing compound is concentrated in or near the top layer, e.g. in an intermediate layer between the layer comprising the polymeric binder and the top layer.

The printing plate precursor of the present invention can be exposed to infrared light with LEDs or a laser. Preferably, a laser emitting near infrared light having a wavelength in the range from about 750 to about 1500 nm is used, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mw to about 1 W operate at a lower scan speed, e.g. from 0.1 to 10 m/sec.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

In the development step, the non-image areas of the coating are removed by immersion in an aqueous alkaline developer, which may be combined with mechanical rubbing, e.g. by a rotating brush. The developer preferably has a pH above 10, more preferably above 12. The development step may be followed by a rinsing step, a gumming step, a drying step and/or a post-baking step.

The printing plate thus obtained can be used for conventional, so-called wet offset printing, in which ink and an aqueous dampening liquid is supplied to the plate. Another suitable printing method uses so-called single-fluid ink without a dampening liquid. Single-fluid ink consists of an ink phase, also called the hydrophobic or oleophilic phase, and a polar phase which replaces the aqueous dampening liquid that is used in conventional wet offset printing. Suitable examples of single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase and a polyol phase as described in WO 00/32705.

EXAMPLES

Methods of Evaluation

A suitable method for determining the energy density value for the practical exposure of a positive-working thermal plate will be explained hereafter. A halftone image is exposed on the plate at various energy density values and the actual dot area obtained on the plate, after processing according to the conditions (time, temperature, developer) used, is then measured by means of a reflection densitometer and compared with the target dot area that was set in the software (RIP) of the imagesetter. A typical example of such a method is shown in FIG. 1 wherein the dot area obtained on the plate, exposed with a 50% 200 lpi screen (about 80 lines/cm), is plotted versus the energy density of the exposure. The dot area values were obtained by means of a $^{CC}$Dot$^3$ densitometer, commercially available from Centurfax Ltd. FIG. 1 shows that at low energy densities, the dot area on the plate is larger than the target value of 50%: it is believed that, due to the underexposure, the coating just around the edge of the dot does not dissolve sufficiently rapidly in the developer. At too high energy density values, the overexposure of the coating around the dot leads to dissolution of the edges of the dot, resulting in a dot area value that is lower than 50%. These effects are especially significant when the laser spot has a pronounced gaussian intensity profile and less with a steep intensity profile. From a curve as shown in FIG. 1, it can be established by interpolation at which energy density the obtained dot area coincides with the target value (50%): that value is referred to herein as the 'right exposure energy density' (REED). In other words, the REED value is defined as the minimum energy density at which the dot area on the plate, occupied by a screened image corresponding to a 50% halftone in the image data, coincides with the 50% target value. It is clear to the skilled person that a lower REED value indicates a higher sensitivity of the plate.

Another parameter which can be used for quantifying the sensitivity is the clearing point (CP), which will now be explained. Exposure of a positive-working thermal plate at an energy density which is insufficient to raise the temperature of the coating up to the threshold value of the imaging mechanism has no significant effect on the dissolution kinetics of the exposed area. As a result, after processing according to the conditions (time, temperature, developer) used, the coating normally remains on the support, i.e. the optical density of the coating essentially equals $D_u$, the optical density of the unexposed plate. At higher energy densities, the temperature in the coating approaches and eventually exceeds the threshold temperature and, as a result, the density of the coating that remains on the plate after processing decreases. The minimum energy density that is required to produce a reduction of the optical density of the exposed and processed plate coating by a factor of 95%, i.e. to produce an optical density of $0.05*D_u$, is defined herein as the 'clearing point'.

Figure 2:
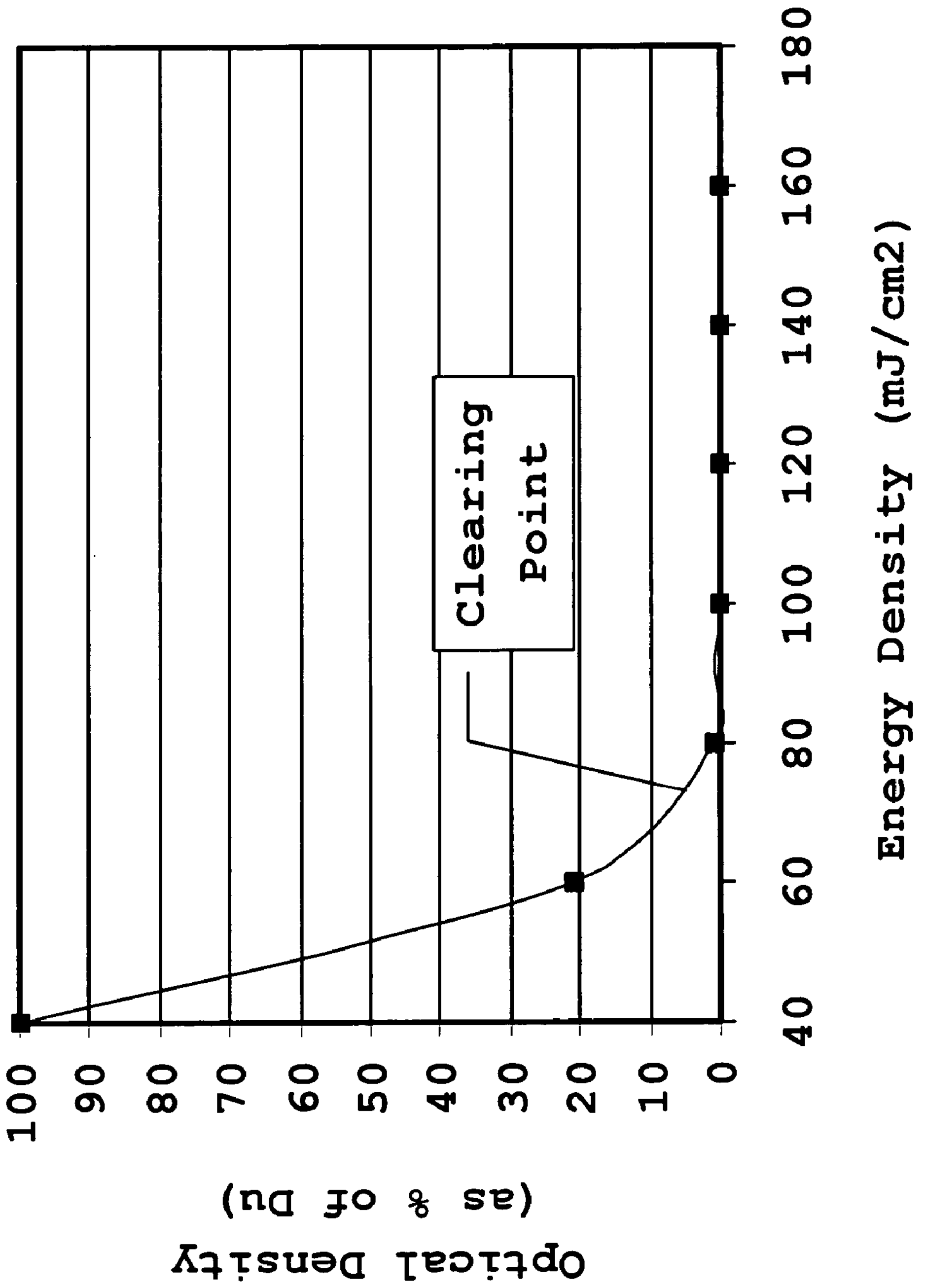
FIG. 2 represents the relationship between the optical density of the coating of Inventive Example 1 after processing and the energy density of the exposure.

CP can be measured by exposing a solid wedge on the plate, i.e. a series of areas consisting entirely of 0% dots (full exposure at all imagesetter pixels) which are exposed on the plate at various energy density values. The method is explained with reference to FIG. 2 wherein these energy density values form a series of discrete values resulting in a step-wedge, but it should be clear to the skilled reader that the energy density values may also vary continuously so as to obtain a continuous wedge. A preferred continuous wedge varies by not more than 10 mJ/cm$^2$ per cm wedge length. The minimum and maximum energy density for exposing the wedge should be adjusted to the particular type of plate that is being tested. The step-wedge used for the present Examples ranged from 30 to 300 mJ/cm$^2$ with intervals of 20 mJ/cm$^2$. The wedge was generated by the software that controls the imagesetter, although similar results can be obtained by other means, e.g. by placing a wedge filter in the light path of the imagesetter, preferably in contact with the plate. CP was determined by plotting the discrete values of optical density of the exposed and processed plate vs. the energy density as shown in FIG. 2 and establishing by interpolation at which energy density the optical density of the coating is reduced by 95%.

In practice it is observed that the CP value is smaller than the REED. The Under-Exposure Latitude (UEL) is defined herein as the difference between the REED and the CP values, expressed as a percentage of the REED: UEL=

(REED−CP)*100/REED. A high UEL value is preferred because fluctuation of processing conditions, batch-to-batch speed variations of the plate precursor, etc., have no significant influence when UEL is high, i.e. when REED is large compared to CP. When UEL is low, shifts of the CP and REED values may result in an incomplete clean-out of the exposed areas, resulting in toning (ink-acceptance at the non-image areas).

Finally, a fourth parameter suitable for characterizing the plate precursor of the present invention is the Developer Resistance (DR). DR is a measure for the resistance of the non-exposed areas towards the developer and is defined as $(D_o-D_2)$*100/$D_o$ wherein $D_o$ is the optical density of the unexposed and undeveloped plate coating, and wherein $D_2$ is the optical density of the coating of the unexposed plate after being put through the processor twice. A smaller value of DR indicates a higher developer resistance.

Optical density values for measuring CP and DR were obtained by means of a GretagMacbeth D19C 47B/P densitometer, commercially available from Gretag—Macbeth AG. Such reflection densitometers are typically equipped with several filters (e.g. cyan, magenta, yellow): the optical density was measured with the filter that corresponds to the color of the coating, e.g. a cyan filter is preferably used for measuring the optical density of a blue colored coating. All optical density values were measured with reference to the uncoated support of the plate.

Preparation of the printing plate precursors.

The printing plate precursors were prepared by coating the solutions defined in Table 1 onto an electrochemically roughened and anodically oxidised aluminium sheet (oxide weight 3 g/m$^2$), the surface of which has been rendered hydrophilic by treatment with an aqueous solution of polyvinyl phosphonic acid, at a wet coating thickness of 26 μm and then dried. After drying the coating at 135° C. the resulting thickness of the layer was 1.07 g/m$^2$.

TABLE 1

Compositions of the coating solutions.

| Ingredients (g) | Example 1 | Example 2 | Example 3 | Example 4 | Example 5 | Comp. Example |
|---|---|---|---|---|---|---|
| Tetrahydrofuran | 440.2 | 440.2 | 440.2 | 440.2 | 440.2 | 440.2 |
| Polymer MP-22 (1) | 441.33 | 441.33 | 441.33 | 441.33 | 441.33 | 441.33 |
| Methoxypropanol | 603.02 | 603.02 | 603.02 | 603.02 | 603.02 | 603.02 |
| Methylethylketon | 561.31 | 561.31 | 561.31 | 561.31 | 561.31 | 561.31 |
| S0094 (2) | 3.18 | 3.18 | 3.18 | 3.18 | 3.18 | 3.18 |
| Tego Glide 410 (3) | — | — | — | — | — | 45.49 |
| SIL 1 (4) | 45.49 | — | — | — | — | — |
| SIL 2 (4) | — | 45.49 | — | — | — | — |
| SIL 3 (4) | — | — | 45.49 | — | — | — |
| SIL 4 (4) | — | — | — | 45.49 | — | — |
| SIL 5 (4) | — | — | — | — | 45.49 | — |
| 3,4,5-tri-hydroxybenzophenon | 5.46 | 5.46 | 5.46. | 5.46 | 5.46 | 5.46 |

(1) 20 wt % solution of polymer MP-22, a modified novolac in Dowanol PM (Dowanol PM is 1-methoxy-2-propanol from Dow Chemical Company).
The polymer MP-22 is prepared by the following method:
Preparation of the diazonium solution:
A mixture of 2.6 g AM-10 and 25 ml acetic acid and 37.5 ml water was cooled to 15° C. Then 2.5 ml concentrated HCl was added and the mixture was further cooled to 0° C. Then, a solution of 1.1 g $NaNO_2$ in 3 ml water was added dropwise after which stirring was continued for another 30 minutes at 0° C.
AM-10 is a compound having the following chemical structure:

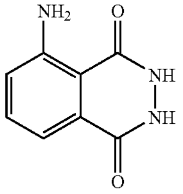

Preparation of the phenolic polymer solution:
A mixture of 45.9 g ALNOVOL SPN452 (Alnovol SPN452 is a solution of a novolac resin, 40% by weight in Dowanol PM, obtained from Clariant GmbH), 16.3 g $NaOAc.3H_2O$ and 200 ml 1-methoxy-2-propanol was stirred and cooled to 10° C.
The above prepared diazonium solution was added dropwise to the phenolic polymer solution over a 30 minute period after which stirring was continued for 120 minutes at 15° C. The resulting mixture was then added to 2 liters ice-water over a 30 minute period while continuously stirring. The polymer was precipitated from the aqueous medium and was isolated by filtration. The desired product was finally obtained by washing with water and subsequent drying at 45° C.
(2) cyanine dye commercially available from PEW Chemicals. S0094 has the chemical structure IR-1 shown above.
(3) surfactant commercially available from Tego Chemie Service GmbH. 1 wt % solution in 1-methoxy-2-propanol.
(4) 1 wt. % of a CAM-polysiloxane solution in Dowanol.

Exposure and development of the printing plate precursors.

The printing plate precursors were exposed with a CREO TRENDSETTER 3244 T (plate-setter available from CREO, Burnaby, Canada) operating at 2450 dpi with a 50% screen (200 lpi) and with a solid area (100%) at different energy densities ranging from 60 $mJ/cm^2$ up to 280 $mJ/cm^2$.

After imaging, the plates were developed using an AUTOLITH T processor, operating at 25° C., in a developing solution specified in Table 2. During the development the IR-exposed areas are removed.

TABLE 2

| Developing solution | |
|---|---|
| Ingredient | Parts by weight |
| Demineralised water | 870 g |
| Sodium metasilicate.5aqua | 108 g |
| Supronic B25 (1) | 0.135 g |
| Sorbitol (70 wt. % solution in water) | 41.7 ml |

(1): commercially available from RODIA.

The developer resistance (DR), real exposed sensitivity (REED), clearing point sensitivity (CP) and under-exposure latitude (UEL) were determined and are summarized in Table 3.

TABLE 3

| DR, REED, CP, UEL. | | | | | | |
|---|---|---|---|---|---|---|
| | Invention example 1 | Invention exam ple 2 | Invention example 3 | Invention example 4 | Invention example 5 | Comp. Example |
| DR % | <3 | <3 | <3 | <3 | <3 | <3 |
| REED $mJ/cm^2$ | 235 | 233 | 225 | 226 | 221 | 242 |
| CP $mJ/cm^2$ | 113 | 111 | 100 | 98 | 103 | 120 |
| UEL % | 51.9 | 52.4 | 55.6 | 57.5 | 53.4 | 50.4 |

The results of Table 3 clearly show that the printing plate precursors containing a CAM-polysiloxane have an improved sensitivity over the comparative example (REED and CP are lower) and a slightly increased under-exposure latitude while the developer resistance DR is not significantly reduced (less than 3%).

The invention claimed is:

1. A positive-working lithographic printing plate precursor comprising on a support having a hydrophilic surface or which is provided with a hydrophilic layer, an oleophilic coating comprising an infrared absorbing agent, an alkali-soluble polymeric binder and a polysiloxane comprising a plurality of recurring units represented by —Si(RR')—O— wherein R and R' independently represent an alkyl, an aryl or a polyalkylene-oxide group, the polysiloxane further comprising at least one carboxylic acid group or a salt thereof and at least one linker group, wherein the at least one linker group is bonded to an end of the polysiloxane, and wherein at least one carboxylic acid group or a salt thereof is bonded to the linker group.

2. A positive-working lithographic printing plate precursor according to claim 1, wherein the polysiloxane comprises at least two carboxylic acid groups or salts thereof and two linker groups, wherein a linker group is bonded to each end of the polysiloxane, and wherein a carboxylic acid group or a salt thereof is bonded to each linker group.

3. A positive-working lithographic printing plate precursor according to claim 2, wherein the alkali-soluble polymeric binder is a phenolic resin.

4. A positive-working lithographic printing plate precursor according to claim 2, wherein the coating further comprises a dissolution inhibitor comprising an organic compound comprising an aromatic group and a hydrogen bonding site.

5. A positive-working lithographic printing plate precursor according to claim 1, wherein the coating further comprises a dissolution inhibitor comprising an organic compound comprising an aromatic group and a hydrogen bonding site.

6. A positive-working lithographic printing plate precursor according to claim 1, wherein the alkali-soluble polymeric binder is a phenolic resin.

7. A positive-working lithographic printing plate precursor according to claim 1, wherein the polysiloxane is present in the coating in an amount ranging from 0.5 to 25 $mg/m^2$.

8. The positive-working lithographic printing plate precursor according to claim 1, wherein the linker group is alkylene, arylene, heteroarylene, —O—, $—O—(CH_2)_k—$, $—O—CO—(CH_2)_k—$, $—(CH_2)_k—O—CO—(CH_2)_l—$, $—(CH_2)_k—CO—(CH_2)_l—$, $—CO—O—(CH_2)_k—$, $—(CH_2)_k—COO—(CH_2)_l—$, $—CO—(CH_2)_k—$ or combinations thereof, wherein k and 1 independently represent an integer ≧1.

9. The positive-working lithographic printing plate precursor according to claim 8, wherein the linker group is alkylene, $—O—(CH_2)_k—$, $—(CH_2)_k—CO—(CH_2)_l—$ or $—CO—(CH_2)_k—$.

10. The positive-working lithographic printing plate precursor according to claim 9, wherein the recurring units are diphenyl-siloxanes, dimethyl-siloxanes and/or phenylmethyl-siloxanes.

11. A positive-working lithographic printing plate precursor comprising, on a support having a hydrophilic surface or which is provided with a hydrophilic layer, an oleophilic coating comprising an infrared absorbing agent, an alkali-soluble polymeric binder and a polysiloxane, wherein the polysiloxane comprises a plurality of recurring units represented by —Si(RR')—O— wherein R and R' independently represent an alkyl, an aryl or a polyalkylene-oxide group, the polysiloxane further comprising at least one carboxylic acid group or a salt thereof and at least one linker group, wherein a linker group is bonded to an end of the polysiloxane, wherein at least one carboxylic acid group or a salt thereof is bonded to the linker group, wherein the alkali-soluble polymeric binder is a phenolic resin, and wherein the phenolic resin is a novolac resin, a resol resin or a polyvinylphenol and the phenyl group or the hydroxy group of the phenolic monomeric unit of the phenolic resin is chemically modified with an organic substituent.

12. A positive-working lithographic printing plate precursor according to claim 11, wherein the polysiloxane is present in the coating in an amount ranging from 0.5 to 25 $mg/m^2$.

13. A positive-working lithographic printing plate precursor according to claim 12, wherein the coating further comprises a dissolution inhibitor comprising an organic compound comprising an aromatic group and a hydrogen bonding site.

14. A positive-working lithographic printing plate precursor according to claim 11, wherein the polysiloxane comprises at least two carboxylic acid groups or salts thereof and two linker groups, wherein a linker group is bonded to each end of the polysiloxane, and wherein a carboxylic acid group or a salt thereof is bonded to each linker group.

15. A positive-working lithographic printing plate precursor according to claim 14, wherein the coating further comprises a dissolution inhibitor comprising an organic compound comprising an aromatic group and a hydrogen bonding site.

16. A positive-working lithographic printing plate precursor according to claim 11, wherein the coating further comprises a dissolution inhibitor comprising an organic compound comprising an aromatic group and a hydrogen bonding site.

17. The positive-working lithographic printing plate precursor according to claim 11, wherein the linker group is alkylene, arylene, heteroarylene, —O—, —O—$(CH_2)_k$—, —O—CO—$(CH_2)_k$—, —$(CH_2)_k$—O—CO—$(CH_2)_l$—, —$(CH_2)_k$—CO—$(CH_2)_l$—, —CO—O—$(CH_2)_k$—, —$(CH_2)_k$—COO—$(CH_2)_l$—, —CO—$(CH_2)_k$— or combinations thereof, wherein k and 1 independently represent an integer ≧1.

18. A method for making a positive-working lithographic printing plate precursor comprising the steps of: (a) providing a support having a hydrophilic surface or which is provided with a hydrophilic layer, and (b) applying onto the hydrophilic surface or hydrophilic layer an oleophilic coating comprising an infrared absorbing agent, an alkali-soluble polymeric binder and a polysiloxane, the polysiloxane comprising a plurality of recurring units represented by —Si(RR')—O— wherein R and R' independently represent an alkyl, an aryl or a polyalkylene-oxide group, the polysiloxane further comprising at least one carboxylic acid group or a salt thereof and at least one linker group, wherein a linker group is bonded to an end of the polysiloxane, and wherein at least one carboxylic acid group or a salt thereof is bonded to the linker group.

19. A method according to claim 18, wherein the coating further comprises a dissolution inhibitor comprising an organic compound comprising an aromatic group and a hydrogen bonding site.

20. A method for making a positive-working lithographic printing plate precursor according to claim 18, wherein the polysiloxane is present in the coating in an amount ranging from 0.5 to 25 mg/m$^2$.

21. A method for making a positive-working lithographic printing plate precursor according to claim 18, wherein the linker group is alkylene, arylene, heteroarylene, —O—, —O—$(CH_2)_k$—, —O—CO—$(CH_2)_k$—, —$(CH_2)_k$—O—CO—$(CH_2)_l$—, —$(CH_2)_k$—CO—$(CH_2)_l$—, —CO—O—$(CH_2)_k$—, —$(CH_2)_k$—COO—$(CH_2)_l$—, —CO—$(CH_2)_k$— or combinations thereof, wherein k and 1 independently represent an integer ≧1.

22. A method for making a positive-working lithographic printing plate comprising the steps of:

(a) exposing imagewise a heat-sensitive lithographic printing plate precursor to infrared light, the printing plate precursor comprising, on a support having a hydrophilic surface or which is provided with a hydrophilic layer, an oleophilic coating comprising an infrared absorbing agent, an alkali-soluble polymeric binder and a polysiloxane, wherein the polysiloxane comprises a plurality of recurring units represented by —Si(RR')—O— wherein R and R' independently represent an alkyl, an aryl or a polyalkylene-oxide group, the polysiloxane further comprising at least one carboxylic acid group or a salt thereof and at least one linker group, wherein a linker group is bonded to an end of the polysiloxane, and wherein at least one carboxylic acid group or a salt thereof is bonded to the linker group, and (b) developing the imagewise exposed printing plate precursor with an aqueous alkaline developer so that the imagewise exposed areas are dissolved.

23. A method according to claim 22, wherein the polysiloxane comprises at least two carboxylic acid groups or salts thereof and two linker groups, wherein a linker group is bonded to each end of the polysiloxane and wherein a carboxylic acid group or a salt thereof is bonded to each linker group.

24. A method according to claim 23, wherein the alkali-soluble polymeric binder is a phenolic resin.

25. A method according to claim 22, wherein the coating further comprises a dissolution inhibitor comprising an organic compound comprising an aromatic group and a hydrogen bonding site.

26. A method for making a positive-working lithographic printing plate precursor according to claim 22, wherein the polysiloxane is present in the coating in an amount ranging from 0.5 to 25 mg/m$^2$.

27. A method for making a positive-working lithographic printing plate comprising the steps of:

(a) exposing imagewise a heat-sensitive lithographic printing plate precursor to infrared light, the printing plate precursor comprising, on a support having a hydrophilic surface or which is provided with a hydrophilic layer, an oleophilic coating comprising an infrared absorbing agent, an alkali-soluble polymeric binder and a polysiloxane, wherein the polysiloxane, wherein the polysiloxane comprises a plurality of recurring units represented by —Si(RR')—O— wherein R and R' independently represent an alkyl, an aryl or a polyalkylene-oxide group, the polysiloxane further comprising at least one carboxylic acid group or a salt thereof and at least one linker group, wherein a linker group is bonded to an end of the polysiloxane, and wherein at least one carboxylic acid group or a salt thereof is bonded to the linker group, and (b) developing the imagewise exposed printing plate precursor with an aqueous alkaline developer so that the exposed areas are dissolved, wherein the alkali-soluble polymeric binder is a phenolic resin, and wherein the phenolic resin is a novolac resin, a resol resin or a polyvinylphenol and the phenyl group or the hydroxy group of the phenolic monomeric unit of the phenolic resin is chemically modified with an organic substituent.

28. A method according to claim 27, wherein the coating further comprises a dissolution inhibitor comprising an organic compound comprising an aromatic group and a hydrogen bonding site.

29. A method for making a positive-working lithographic printing plate precursor according to claim 27, wherein the polysiloxane is present in the coating in an amount ranging from 0.5 to 25 mg/m$^2$.

30. A positive-working lithographic printing plate precursor comprising on a support having a hydrophilic surface or which is provided with a hydrophilic layer, an oleophilic coating comprising an infrared absorbing agent, an alkali-soluble polymeric binder and a polysiloxane comprising a plurality of recurring units, the polysiloxane further comprising at least one carboxylic acid group or a salt thereof and at least one linker group, wherein the at least one linker group is bonded to an end of the polysiloxane, and wherein at least one carboxylic acid group or a salt thereof is bonded to the linker group.

* * * * *